United States Patent
Floman et al.

(10) Patent No.: US 7,562,193 B2
(45) Date of Patent: Jul. 14, 2009

(54) MEMORY WITH SINGLE AND DUAL MODE ACCESS

(75) Inventors: Matti Floman, Kangasala (FI); Jani Klint, Tampere (FI)

(73) Assignee: Nokia Corporation, Espoo (FI)

( * ) Notice: Subject to any disclaimer, the term of this patent is extended or adjusted under 35 U.S.C. 154(b) by 249 days.

(21) Appl. No.: 10/828,516

(22) Filed: Apr. 19, 2004

(65) Prior Publication Data

US 2005/0235117 A1 Oct. 20, 2005

(51) Int. Cl.
*G06F 12/00* (2006.01)
*G06F 13/00* (2006.01)
*G06F 13/28* (2006.01)
*G11C 8/00* (2006.01)

(52) U.S. Cl. ............... 711/149; 711/104; 711/105; 711/111; 711/112; 711/131; 711/147; 711/153; 365/230.05

(58) Field of Classification Search ............ 711/131, 711/153, 104–105, 111–112, 147–149, 113; 365/230.05
See application file for complete search history.

(56) References Cited

U.S. PATENT DOCUMENTS

| | | | |
|---|---|---|---|
| 4,893,279 A * | 1/1990 | Rahman et al. | 365/230.03 |
| 5,329,630 A * | 7/1994 | Baldwin | 711/173 |
| 5,631,577 A | 5/1997 | Freidin et al. | |
| 5,996,051 A * | 11/1999 | Mergard | 711/147 |
| 6,065,092 A * | 5/2000 | Roy | 711/5 |
| 6,167,487 A | 12/2000 | Camacho et al. | |
| 6,170,041 B1 | 1/2001 | Levasseur et al. | |
| 6,499,089 B1 | 12/2002 | Phelan et al. | |
| 6,826,657 B1 * | 11/2004 | Ware et al. | 711/149 |
| 6,898,678 B1 * | 5/2005 | Six et al. | 711/151 |

* cited by examiner

*Primary Examiner*—Tuan V Thai
*Assistant Examiner*—Yaima Campos
(74) *Attorney, Agent, or Firm*—Ware, Fressola Van Der Sluys & Adolphson LLP

(57) ABSTRACT

The invention relates to a memory unit with at least two memory areas for storing data, first terminals for accessing data within the memory areas, and second terminals for accessing data within the memory areas. To provide multipurpose access to the memory, the memory unit provides at least two access control means for providing selectively sole addressing and accessing data through one of the terminals, or individual addressing and accessing data through each of the terminals, respectively.

33 Claims, 5 Drawing Sheets

MEMORY WITH SINGLE AND DUAL MODE ACCESS

FIELD OF THE INVENTION

The invention relates to a memory unit with at least two memory areas for storing data, first terminals for accessing data within the memory areas, and second terminals for accessing data within the memory areas.

The invention also relates to a method for providing access to a memory unit by receiving access signals and providing data from memory areas through first terminals, and receiving access signals and providing data from memory areas through second terminals.

The invention also relates to a system for providing memory with a first processor in communication with the memory unit, and a second processor in a communication with the memory unit.

Finally, the invention relates to a module for providing memory to processors, and a mobile communication device comprising memory units.

BACKGROUND OF THE INVENTION

In electrical devices and consumer electronic devices, such as hand-held computers, personal computers, mobile communication devices, mobile gaming devices, and other electrical devices, memory is required for proper processing. In particular dynamic random access memory (DRAM) may be used in these devices. However, different memory technologies may also be implemented within these devices.

According to current needs, different processors within a device need access to memory. Therefore, dual port memories are provided. These dual port memories may provide a main central processing unit (CPU) with memory access as well as a separated imaging processor. The CPU may have a low leakage process and the imaging processor may have a high leakage process. For power saving reasons, for instance, imaging processors may be driven down when not used. Therefore, separate memory units would provide good results for both imaging processor, and CPU.

However, without dual port technology, signals for imaging processors are required to be routed through the main CPU to access the memory. This would increase total pin count at the main ASIC. Priority for memory access needs to be agreed on between imaging processor, and CPU memory access. Access arbitration may also be required. This may reduce computation speed.

SUMMARY OF THE INVENTION

To overcome these problems, embodiments provide a memory unit with at least two memory areas for storing data, first terminals for accessing data within the memory areas, and second terminals for accessing data within the memory areas, characterised by at least two access control means for providing selectively sole addressing and accessing data through one of the terminals, or individual addressing, and accessing data through each of the terminals, respectively.

By providing access control means which allow accessing the memory in two modes, one of which is a single mode and allows sole addressing, and accessing data through one of the terminals, and the other of which is a dual mode, which allows individually addressing, and accessing data through each of the terminals, respectively, allows keeping the number of different memory technologies within devices as low as possible. The inventive memory unit provides both dual port technology and high performance within one unit. Dual port mode, where individual addressing is possible, allows accessing memory through each of the terminals individually. In single mode, where sole addressing is possible, only one terminal allows read/write access to the memory. The data bandwidth in single mode may be broader than in dual mode, as in dual mode the data bus bandwidth has to be shared by at least two terminals, whereas in single mode only one terminal may use the whole data bus. However, also in single mode, not the whole bus bandwidth needs to be used. This might be required to support older memory architecture.

Also, certain devices might require dual mode, whereas other devices require high performance single mode, both of which may be provided by the inventive memory unit. The cost for providing memory may thus be reduced, as only one memory device is required.

Accessing the memory in dual mode allows different processors accessing memory independently from each other. Therefore, no CPU delay is accounted, as the CPU does not have to arbitrate between memory access requests of different processes or applications. In single mode, a higher data bus bandwidth may be used, which may allow reducing the clock frequency, increasing signal integrity issues.

According to embodiments, the first and/or second terminals comprise a control port for receiving control signals for controlling access to the memory areas from a control bus. According to embodiments, the first and/or second terminals comprise an address port for receiving addressing signals for addressing data within the memory areas from an address bus. Embodiments provide the first and/or second terminals with a data port for reading and/or writing data to and/or from the memory areas to/from a data bus.

The data bus width may be $2^N$, with N an integer. For instance data bus bandwidths of 8, 16, 32, 64, . . . bit are supported. No particular bus protocol is necessary. The inventive memory unit may support single data rate (SDR) as well as double data rate (DDR) protocol, or any other protocol for control, address and/or data bus.

According to embodiments, the access control means are state machines, which state machines provide access to the data areas based on states of signals at the first and second terminals. The state machines may allow access arbitration for accessing memory areas through the first and second terminals. To provide caching for accessing data through the first and second terminals, each of the access control means may comprise memory registers according to embodiments.

The inventive first and second terminals may be comprised within one set of connection pins. These connection pins may be provided with signals according to the supported protocols. An external address bus may be connected to the respective address port of the terminals. An external data bus may be connected to the respective data port of the terminals and an external control bus may be connected to the control ports of the terminals.

According to embodiments, the control means provide in single mode access to the memory areas by the control port and the address port of one of the terminals and may provide the data through the data ports of both terminals. In this case sole addressing and accessing the data is supported. Thereby, the full data bus width may be used through addressing and accessing the data through address ports and control ports of one of the terminals.

In dual mode, the control means may provide access to at least one memory area by the control ports and the address ports of the terminals, respectively, and may provide the data through the data ports of the terminals, respectively, in case of individual addressing, according to embodiments. By that each of the terminals may be used independently. Addressing and accessing memory of at least one memory area may be provided through a first terminal independently from accessing and addressing data of at least another memory area through a second terminal.

According to embodiments, in dual mode, the control means may provide access to at least one memory area by both of the control ports of the terminals, and may provide data through both data ports of the terminals, respectively, in case of individual addressing. By that a particular memory area may be used for accessing through both of the terminals.

According to embodiments, at least two memory areas are provided. These at least two memory areas may be accessed through the first and second terminals, individually, or through one of the terminals solely.

Embodiments provide programming the size of the memory areas through one of the terminals. By that, the size of the memory areas may be programmed to current needs.

Access arbitration may in be useful, in case of three provided memory areas, according to embodiments.

For individual access during dual mode, embodiments provide access to two of the three memory areas by the control ports and the address ports of the respective terminals, and the data of the memory areas through the data ports of the respective terminals.

A third memory area may be provided according to embodiments, which may be accessed by the control and address ports of both of the terminals, respectively, and the data may be provided through the data ports of the respective terminals.

As according to embodiments, access to one memory area may be allowed by both terminals, embodiment provide prioritised access to the memory areas to one of the terminals through the access control means.

The memory areas may be fixed in size or may be defined during operation. Embodiments provide access to memory size control to at least one of the control ports. In addition, access to dual mode or single mode may be triggered through at least one of the control ports.

Access through one of the terminals may be predefined during manufacturing of the memory. According to these embodiments at one terminal may have optionally access to all memory areas. Data may be provided via both data ports, providing a wide data bus.

Dual port technology may be useful in embodiments, where one of the terminals provides accessing the data by a central processing unit, and wherein one of the terminals provides accessing the data by a graphics processor. By that each of the processors may access memory independently. Memory size, data bus width, address bus width, control bus width and clocking frequency may be adjusted according to the needs of the respective processor.

Therefore, embodiments provide different width and/or clocking frequency for the terminals, respectively. Speed categories may result due to DRAM yield problems. As not 100% of all dies will meet requirements for maximum clock frequency, two speed categories may be provided.

Another aspect of the invention is a method for providing access to an inventive memory unit by receiving access signals and providing data from memory areas through first terminals, and receiving access signals and providing data from memory areas through second terminals, characterised by selectively receiving access signals solely through one terminal and providing data from memory areas through both terminals, or receiving access signals and providing data from memory areas through both terminals individually, respectively.

A further aspect of the invention is a system for providing memory with a first processor in communication with a memory unit, and a second processor in communication with the memory unit, characterised by at least two access control means for providing selectively sole addressing and accessing data by one of the processors, or individually addressing and accessing data by each of the processors, respectively.

An additional aspect of the invention is a module for providing memory to processors, comprising connection terminals providing communication between an electronic circuit and an inventive memory unit.

Eventually, an aspect of the invention is a mobile communication device comprising such an inventive memory unit.

DETAILED DESCRIPTION OF THE DRAWINGS

Figure 1:
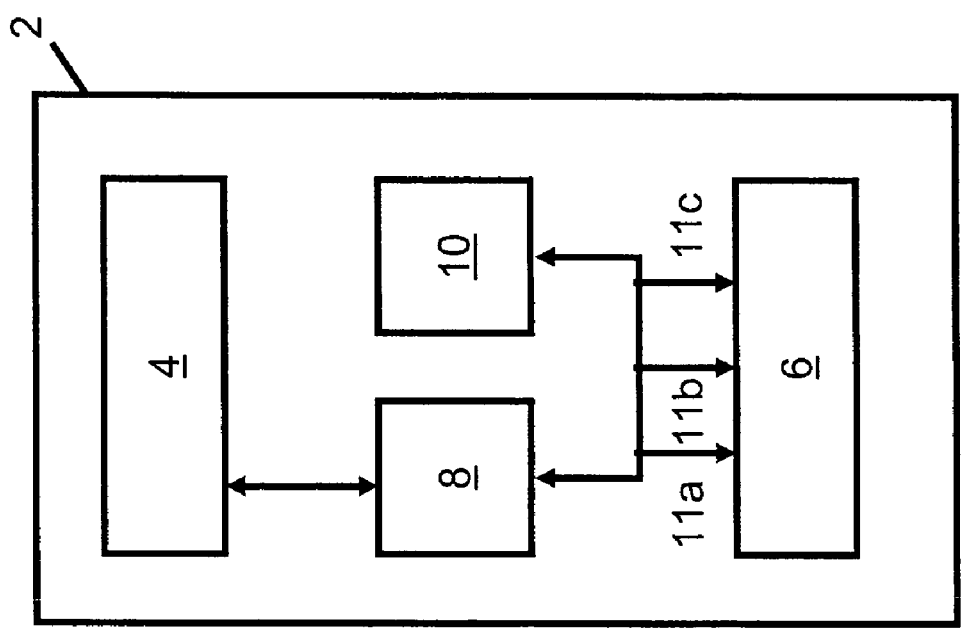
FIG. 1 shows schematically a communication device according to the invention.

FIG. 1 shows a mobile communication device 2. The mobile communication device 2 may comprise a display 4, memory module 6, graphics processor 8, and central processing unit 10.

Graphics processor 8, and central processing unit 10 may communicate with memory module 6 using internal buses 11. Internal bus 11 may comprise an address bus 11a, a control bus 11b, and a data bus 11c.

Central processing unit 10 may be responsible for controlling graphics processor 8 and communication elements (not depicted) within mobile communication device 2.

Graphics processor 8 provides control information for display 4 for displaying any graphics. Bus 11 may be divided up into two independent buses according to embodiments. The width may be 8, 16, 32, or 64 bits. Different bus protocols, such as single data rate (SDR) and double data rate (DDR) may be provided according to embodiments. By providing separation of bus 11 into two independent buses, each of the components central processing unit 10 and graphics processor 8 may access memory module 6 independently.

In case memory module 6 is used in dual mode, the independent access of graphics processor 8 and central processing unit 10 to memory module 6 avoids delays due to CPU memory arbitration. In single mode, one of the devices graphics processor 8, or central processing unit 10 may access memory module 6 solely. As double bus width may be used, clock frequency may be reduced, thereby reducing signal integrity issues.

During dual port mode, each of the buses 11 and the ports 12, 14, 16 of memory module 6 work individually, using their own connection pins at the respective terminals 12a, 14a, 16a, or 12b, 14b, 16b, as will be depicted in the following figures. In case of single mode, only one control port 12a, and one address port 14a may be used to provide data via both data ports 16a, 16b. It may also be possible that in single mode the number of ports used on data port 16 may be reduced to provide compatibility with elder memory technology.

Figure 2:
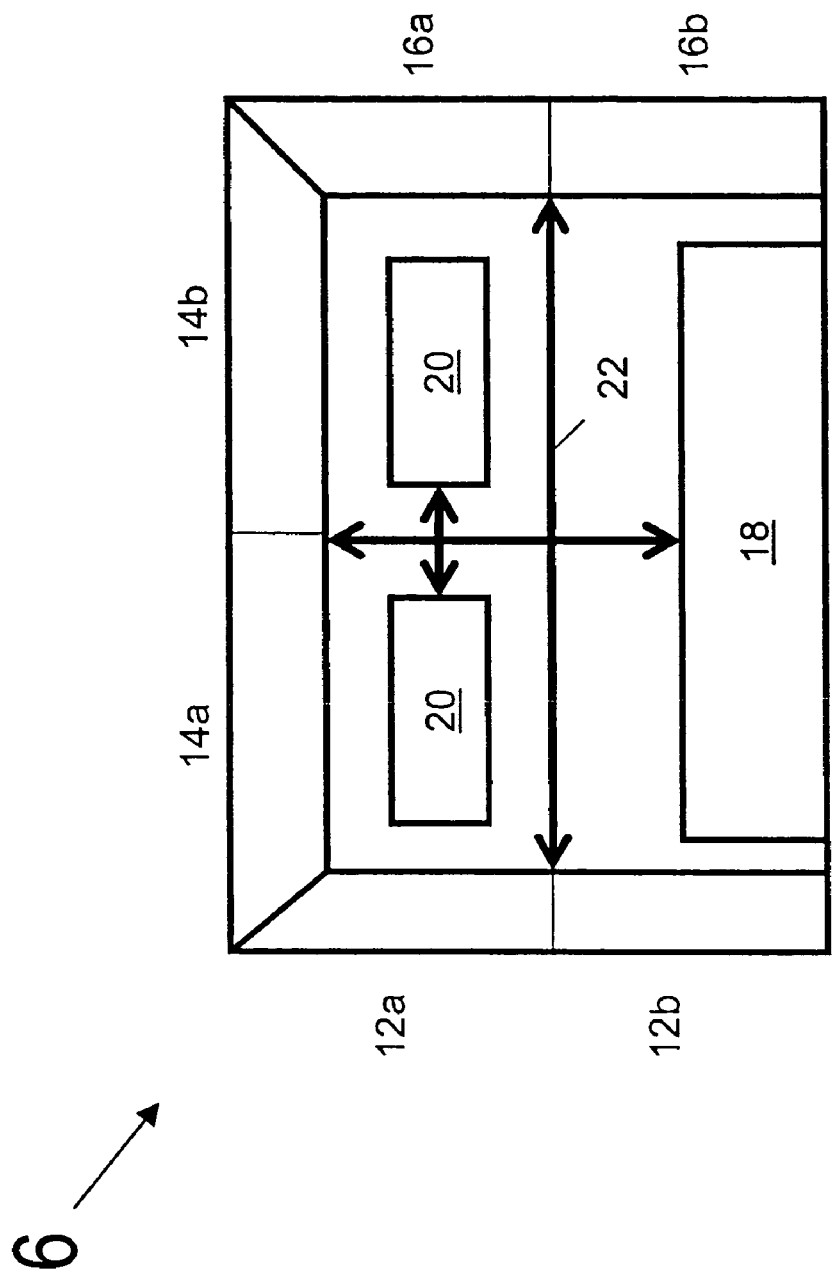
FIG. 2 shows a memory module according to the invention.

FIG. 2 depicts a memory module 6. Memory module 6 comprises first terminals 12a, 14a, 16a and second terminals 12b, 14b, 16b. The terminals provide access to control port 12, address port 14, and data port 16. Internally, state machines 20 are provided for providing access to memory array 18. Communication within memory module 6 is provided by internal bus 22. Internal bus 22 connects control ports 12, address port 14, and data port 16 with state machines 20 and memory array 18. Internal bus 22 may have a bandwidth of 32 bits in case of single data rate and 64 bits in case of double data rate.

If single mode is supported, control port 12*a*, and address port 14*a* are supported, and data is provided through data ports 16*a*, 16*b*. Control port 12*a*, and address port 14*a* may solely access, in read/write mode, memory array 18. State machine 20 provides only control port 12*a*, and address port 14*a* may access memory array 18. Control port 12*b*, and address port 14*b* may in this case, according to embodiments, not access memory array 18.

In dual mode, state machines 20 provide access to memory array 18 via both terminals 12*a*, 14*a*, 16*a*, and 12*b*, 14*b*, 16*b*. Control port 12*a*, and address port 14*a* may access one area within memory array 18, which data may be provided through data port 16*a*. Control port 12*b* and address port 14*b* may access another area within memory array 18 which data may be provided through data port 16*b*.

It may be possible, according to embodiments, to define, which memory area each state machine 20 may access. In case of single mode, it is not required to define different memory areas within memory array 18, as only one set of ports may access memory array 18.

Figure 3:
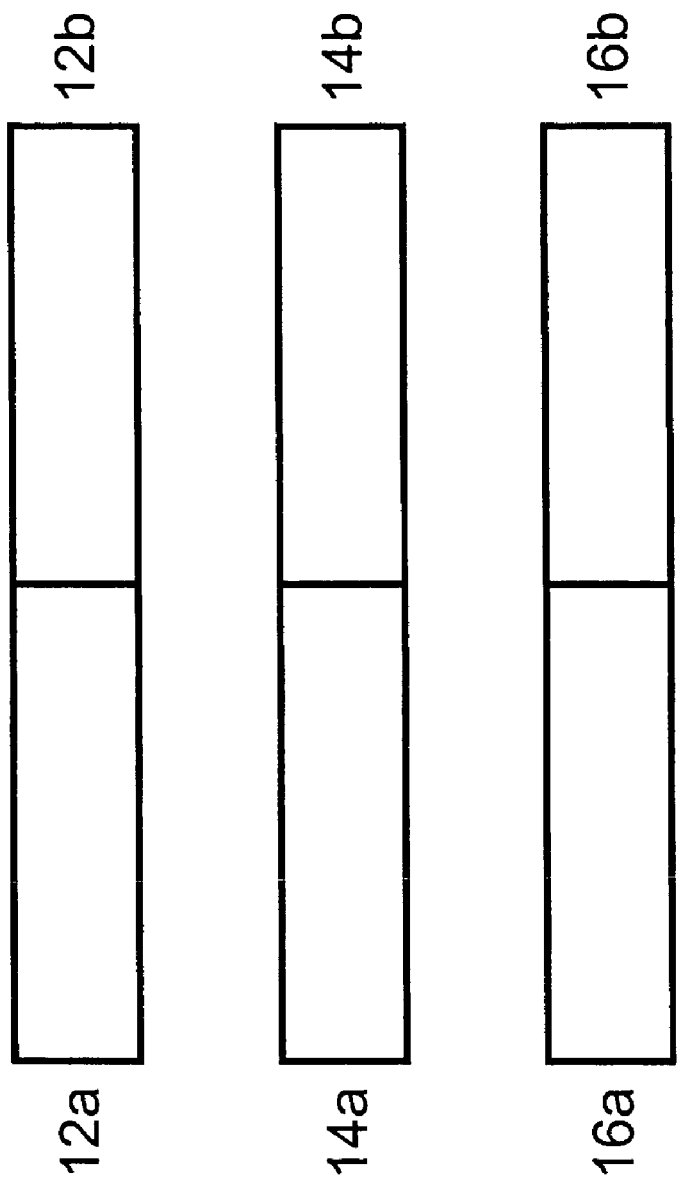
FIG. 3 shows first and second terminals.

FIG. 3 depicts control port 12, address port 14, and data port 16. Depicted are control port 12, address port 14, and data port 16 divided into two terminals 12*a*, 14*a*, 16*a*, and 12*b*, 14*b*, 16*b*. These two terminals 12*a*, 14*a*, 16*a*, and 12*b*, 14*b*, 16*b* may provide access to memory array 18 by two different processors 8, 10. Each of the port 12, 14, 16 has connection pins. The number of connection pins may determine the bandwidth of the respective bus. As seen in FIG. 1, a control bus 11*b* may be connected to control port 12, an address bus 11*a*, may be connected to address port 14, and a data bus 11*c* may be connected to data port 16. The bandwidth of the respective buses may be 8,16, 32, 64bit, according to embodiments.

Figure 4:
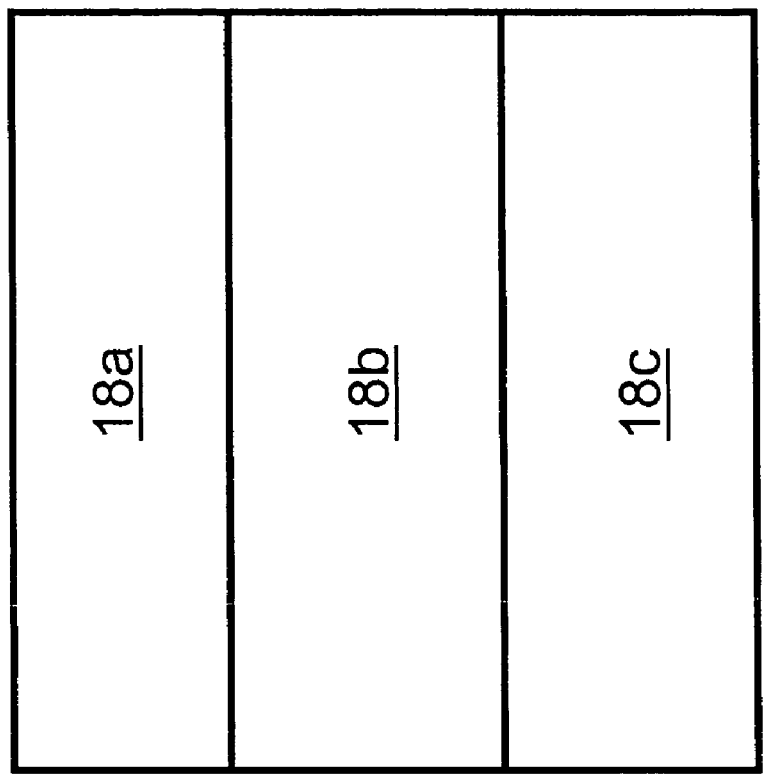
FIG. 4 shows a memory area.

FIG. 4 depicts a memory array 18, with different memory areas 18*a*, 18*b*, 18*c*. Since two individual memory masters may access memory array 18, different areas 18*a*, 18*b*, 18*c* need to be defined. The size of the areas 18*a*, 18*b*, 18*c* may be defined through control ports 12. Access arbitration for dual port access may be carried out within state machines 20, such that memory array 18 is divided into the three areas 18*a*, 18*b*, 18*c*. The start and endpoints of each of the areas 18*a*, 18*b*, 18*c* may be programmable through control port 12*a*. Memory array 18*a* may only be accessed in read/write mode through terminal 12*a*, 14*a*, 16*a*. Memory array 18*b* may be accessible in read/write mode through the terminal 12*b*, 14*b*, 16*b*. Memory area 18*c* may be accessed through both of the terminals 12*a*, 14*a*, 16*a*, 12*b*, 14*b*, 16*b*. Therefore, it may be agreed on that terminal 12*a*, 14*a*, 16*a* may only have write access and terminal 12*b*, 14*b* 16*b* may only have read access. Also, priority may be agreed on, such that terminal 12*a*, 14*a*, 16*a* has priority.

Figure 5:
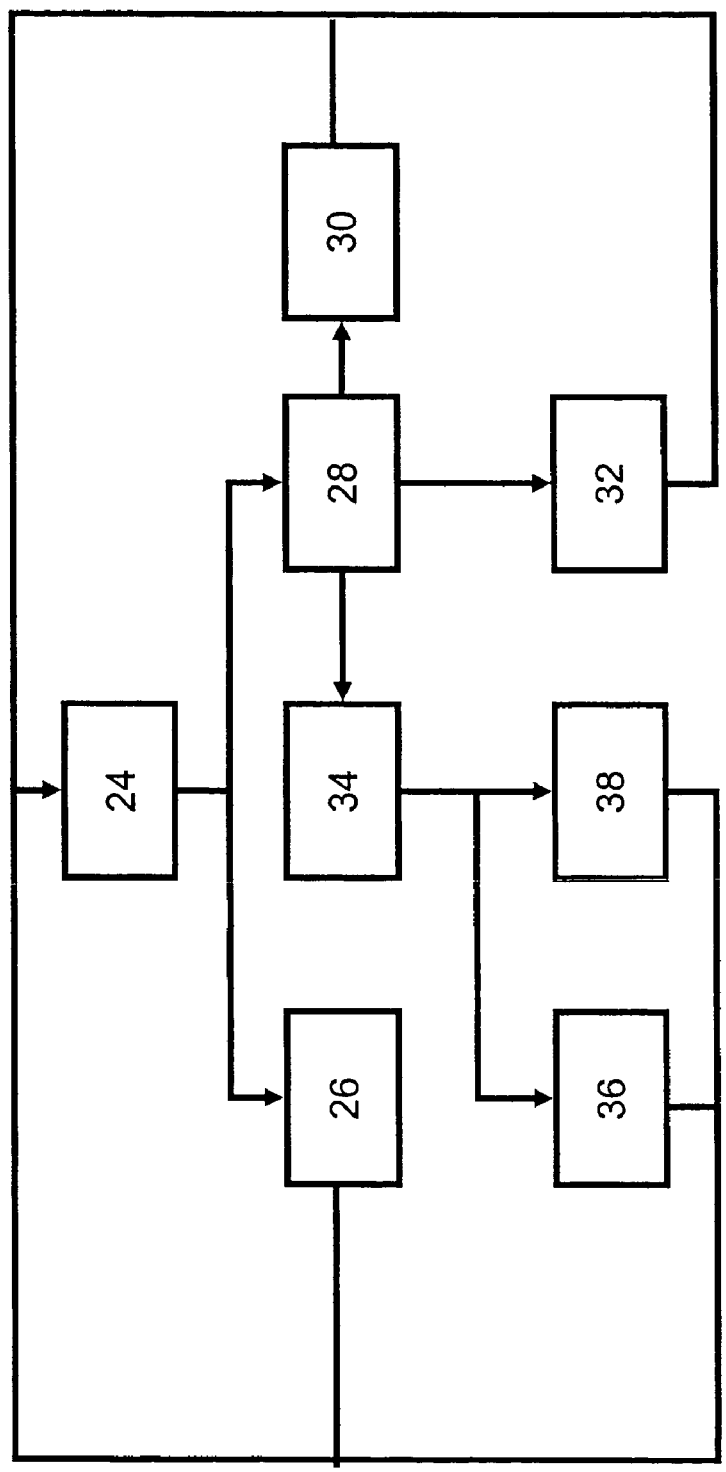
FIG. 5 shows a flowchart of an inventive method.

FIG. 5 depicts a flowchart of embodiments of the invention. First it is checked, whether single mode or dual mode is supported (24). In single mode, access to memory is granted through one of the terminals and data is provided through a whole data bus (26). After data has been read, it may be decided whether single mode or dual mode is supported.

In case dual mode is supported, it is checked, which memory area is accessed (28). In case of access to memory area where one of the terminals has exclusive rights, access is granted. This may be a first memory area for a first terminal (30), and a second memory area for a second terminal (32).

In case a memory area has access through both of the terminals (34), it is checked which of the terminals requests access. In case the prioritised terminal requests access, a write access may be granted (38). In case a non-prioritised terminal requests access, access is only possible in case no other terminal requests access. The terminal may access data in read mode (36).

By providing the inventive dual mode and single mode supporting memory, less memory designs are necessary, as more devices may use the inventive memory. The inventive memory device may be used for different purposes.

What is claimed is:

1. A memory unit comprising:
at least two memory areas configured to store data,
first terminals comprising a data port, the first terminals configured to access data within the memory areas,
second terminals comprising a data port, the second terminals configured to access data within the memory areas,
the first terminals and the second terminals comprising a control port and an address port, and
at least two access controllers selectively providing:
sole addressing and accessing data through one of the terminals, and
individual addressing and accessing data through each of the terminals, respectively,
wherein in case of sole addressing and accessing the data, the access controllers provide access to all of the at least two memory areas by a respective control port and address port of only one of the first terminals and second terminals and provide the data within all of the at least two memory areas through data ports of both the first terminals and second terminals.

2. The memory unit of claim 1, wherein three memory areas are provided, and wherein a third memory area provides access by the control ports and the address ports of both of the terminals, respectively, and the data through the data ports of both of the terminals, respectively.

3. The memory unit of claim 2, wherein two of the three memory areas provide access by the control ports and the address ports of the terminals, respectively, and the data through the data ports of the terminals, respectively.

4. The memory unit of claim 2, wherein the access controllers provide prioritized access to the third memory area through one of the terminals.

5. The memory unit of claim 1, wherein the address ports provide access to an external address bus.

6. The memory unit of claim 1, wherein the first and/or second terminal data ports are configured to read and/or write data to and/or from the memory areas.

7. The memory unit of claim 1, wherein the access controllers provide access to the data areas based on control and/or address signals at said terminals.

8. The memory unit of claim 1, wherein the access controllers are state machines, the state machines providing access to the memory areas based on states of signals at the first and second terminals.

9. The memory unit of claim 1, wherein the access controllers comprise memory registers.

10. The memory unit of claim 1, wherein the access controllers provide access to at least one memory area by the control ports and the address ports of the terminals, respectively, and provide the data through the data ports of the terminals, respectively, in case of individual addressing.

11. The memory unit of claim 10, wherein the access controllers provide access to at least one memory area by both of the control ports and the address ports of the terminals, and provide the data through the data ports of the terminals, respectively, in case of individual addressing.

12. The memory unit of claim 1, wherein at least two memory areas are provided.

13. The memory unit of claim 1, wherein programming the size of the memory areas is provided through one of the terminals.

14. The memory unit of claim 1, wherein one of the terminals provides accessing the data by a central processing unit, and wherein one of the terminals provides accessing the data by a graphics processor.

15. The memory unit of claim 1, wherein the bandwidth and/or clocking frequency for the terminals is different.

16. A module for providing memory to processors, comprising connection terminals providing communication between an electronic circuit and a memory unit according to claim 1.

17. A mobile communication device comprising a memory unit according to claim 1.

18. A method comprising:
receiving access signals and providing data from memory areas for storing data through first terminals comprising a data port,
receiving access signals and providing data from said memory areas through second terminals comprising a data port,
the first terminals and the second terminals comprising a control port and an address port, and
selectively receiving access signals solely through one of said first and second terminals and providing data from memory areas through both said first and second terminals, and
receiving access signals and providing data from memory areas through both of said first and second terminals individually, respectively,
wherein in case of sole addressing and accessing the data, the providing access to all of the memory areas is by a respective control port and address of only one of the first terminals and second terminals and the data within all of the memory areas is provided through data ports of both of said first terminals and second terminals.

19. The method of claim 18, wherein three memory areas are provided, and wherein a third memory area is accessed by the control ports and the address ports of both of the terminals, respectively, and the data through the data ports of both of the terminals, respectively.

20. The method of claim 19, wherein two of the three memory areas are accessed by the control ports and the address ports of the terminals, respectively, and the data through the data ports of the terminals, respectively.

21. The method of claim 19, wherein the access controllers prioritizedly accesses the third memory area through one of the terminals.

22. The method of claim 18, wherein control signals for controlling access to the memory areas are received by control ports of the first and/or second terminal.

23. The method of claim 18, wherein addressing signals for addressing data within the memory areas are received by address ports of the first and/or second terminal.

24. The method of claim 23, wherein an external address bus is accessed by the address ports provided.

25. The method of claim 18, wherein data to and/or from the memory areas is read and/or written by data ports of the first and/or second terminal.

26. The method of claim 18, wherein the access controllers access the data areas based on control and/or address signals at said first and second terminals.

27. The method of claim 18, wherein the access controllers are state machines, the state machines accessing the data areas based on states of signals at the first and second terminals.

28. The method of claim 18, wherein the access controllers accesses at least one memory area by the control ports and the address ports of the terminals, respectively, and provide the data through the data ports of the terminals, respectively, in case of individual addressing.

29. The method of claim 28 wherein the access controllers access at least one memory area by both of the control ports and the address ports of the terminals, and provide the data through the data ports of the terminals, respectively, in case of individual addressing.

30. A system for providing memory comprising:
a first processor, the first processor in communication with a memory unit through first terminals having a data port, and a second processor, the second processor in communication with the memory unit through second terminals having a data port,
the first terminals and the second terminals comprising a control port and an address port, and
at least two access controllers selectively providing:
sole addressing and accessing data by one of the processors, and
individually addressing and accessing data by each of the processors, respectively,
wherein in case of sole addressing and accessing the data, the access controllers provide access to all of the at least two memory areas by a respective control port and address port of only one of said first and second terminals and provide the data within all of the at least two memory areas through data ports of both of said first and second terminals.

31. A memory unit comprising:
at least first and second means for storing data,
first means for accessing data within the first and second means for storing data, said first means for accessing data, said first means for accessing data having a data port, and
second means for accessing data within the first and second means for storing data, said second means for accessing data having a data port,
the first means for accessing data and the second means for accessing data comprising a control port and an address port, and
means for selectively providing
sole addressing and accessing data through one of the first and second means for accessing data, and
individual addressing and accessing data through each of the first and second means for accessing data, respectively,
wherein in case of sole addressing and accessing the data, said means for selectively providing access to the first and second means for storing data is by a respective control port and address port of only one of the first and second means for accessing data within all of the at least two memory areas and provides the data within all of the at least two memory areas through data ports of both the first and second means for accessing data.

32. The memory unit of claim 31, wherein three means for storing data are provided, and wherein the third means for storing data provides access by the control ports and the address ports of both of the first and second means for accessing data, respectively, and the data through the data ports of both of the first and second means for accessing data, respectively.

33. An apparatus, comprising:
at least two memory areas configured to store data,
first terminals having a data port configured to access data within the memory areas,
second terminals having a data port configured to access data within the memory areas,
the first terminals and the second terminals comprising a control port and an address port, and
at least two access controllers selectively providing:
sole addressing and accessing data through one of the terminals, and
individual addressing and accessing data through each of the terminals, respectively,
wherein in case of sole addressing and accessing the data, the access controllers provide access to both of the at least two memory areas by a respective control port and address port of only one of the first terminals and second terminals and provide the data within both of the at least two memory areas through data ports of both the first terminals and second terminals.

* * * * *